US008759866B2

(12) United States Patent
Kashiwao et al.

(10) Patent No.: US 8,759,866 B2
(45) Date of Patent: Jun. 24, 2014

(54) LIGHT EMITTING DEVICE

(75) Inventors: Tomoaki Kashiwao, Tokushima (JP); Takeo Kurimoto, Anan (JP)

(73) Assignee: Nichia Corporation, Anan-Shi (JP)

( * ) Notice: Subject to any disclaimer, the term of this patent is extended or adjusted under 35 U.S.C. 154(b) by 756 days.

(21) Appl. No.: 12/259,899

(22) Filed: Oct. 28, 2008

(65) Prior Publication Data

US 2009/0114936 A1    May 7, 2009

(30) Foreign Application Priority Data

Oct. 29, 2007   (JP) .............................. P 2007-280449

(51) Int. Cl.
*H01L 33/48* (2010.01)
(52) U.S. Cl.
USPC .................................... 257/99; 257/E33.058
(58) Field of Classification Search
USPC ...................... 257/98, 99, E33.072, E33.065, 257/E33.058, E33.066
See application file for complete search history.

(56) References Cited

U.S. PATENT DOCUMENTS

| | | | | |
|---|---|---|---|---|
| 5,298,768 A | * | 3/1994 | Okazaki et al. ................. | 257/81 |
| 5,665,982 A | * | 9/1997 | Torikai ............................ | 257/81 |
| 5,874,748 A | * | 2/1999 | Osawa ............................ | 257/91 |
| D453,745 S | * | 2/2002 | Suenaga ...................... | D13/180 |
| D490,782 S | * | 6/2004 | Suenaga ...................... | D13/180 |
| 6,874,910 B2 | * | 4/2005 | Sugimoto et al. ............. | 362/294 |
| 6,953,952 B2 | * | 10/2005 | Asakawa ...................... | 257/103 |
| D566,664 S | * | 4/2008 | Kong ........................... | D13/180 |

(Continued)

FOREIGN PATENT DOCUMENTS

| | | |
|---|---|---|
| JP | 2002-280616 | 9/2002 |
| JP | 2004-235139 A | 8/2004 |

(Continued)

OTHER PUBLICATIONS

Japanese Office Action, dated Jan. 8, 2013, issued in JP Patent Application No. 2007-280449.
JP Office Action issued in counterpart JP application No. 2007-280449 on Apr. 24, 2012.

*Primary Examiner* — Wael Fahmy
*Assistant Examiner* — Sarah Salerno
(74) *Attorney, Agent, or Firm* — Birch, Stewart, Kolasch & Birch, LLP

(57) ABSTRACT

To provide a light emitting device that makes it possible to form a surface light emitting apparatus of less unevenness in luminance.
The light emitting device 10 of the present invention comprises a light emitting element 30, connecting terminals 21a, 21b connected with the light emitting element 30, a package 12 which has a recess 40 wherein the light emitting element 30 is mounted and from which a part of each connecting terminal 21a, 21b is projected outward, an opening 41 of the recess 40 being elongated in one direction, wherein both side walls of the recess 40 positioned in the longitudinal direction of the recess 40 are inclined surface 43, an angle θ between both the inclined surfaces 43 being 90 degrees or more. In the light emitting device 10 of the present invention, light emitted by the light emitting element 30 is spread sufficiently in the longitudinal direction of the opening 41 so as to produce a band-shaped beam. As a result, when a plurality of light emitting devices 10 are disposed along the longitudinal direction of the light receiving surface 72 of the light guide plate 71 for constituting the surface light emitting apparatus 70, unevenness in luminance can be suppressed from occurring as dark portions are less likely to be generated between adjacent light emitting devices 10.

24 Claims, 13 Drawing Sheets

(56) References Cited

U.S. PATENT DOCUMENTS

| | | | |
|---|---|---|---|
| 7,393,122 B2 * | 7/2008 | Tsuzuki et al. | 362/304 |
| 2002/0134988 A1 * | 9/2002 | Ishinaga | 257/99 |
| 2004/0173810 A1 * | 9/2004 | Lin et al. | 257/100 |
| 2005/0258444 A1 * | 11/2005 | Windisch et al. | 257/98 |
| 2005/0277216 A1 | 12/2005 | Asakawa | |
| 2007/0109792 A1 | 5/2007 | Chosa et al. | |
| 2007/0171673 A1 | 7/2007 | Song et al. | |
| 2009/0097233 A1 | 4/2009 | Ooya et al. | |
| 2009/0189174 A1 * | 7/2009 | Lee et al. | 257/99 |
| 2009/0310062 A1 | 12/2009 | Chosa et al. | |
| 2009/0315061 A1 * | 12/2009 | Andrews | 257/99 |

FOREIGN PATENT DOCUMENTS

| | | |
|---|---|---|
| JP | 2004-363537 A | 12/2004 |
| JP | 2005-252168 | 9/2005 |
| JP | 2006-253550 A | 9/2006 |
| JP | 2006-253551 | 9/2006 |
| JP | 2006-286348 | 10/2006 |
| JP | 2006-351773 A | 12/2006 |
| JP | 2007-27761 A | 2/2007 |
| JP | 1295629-D | 3/2007 |
| WO | WO 2007/004450 A1 | 1/2007 |
| WO | WO 2007/023807 A1 | 3/2007 |

* cited by examiner

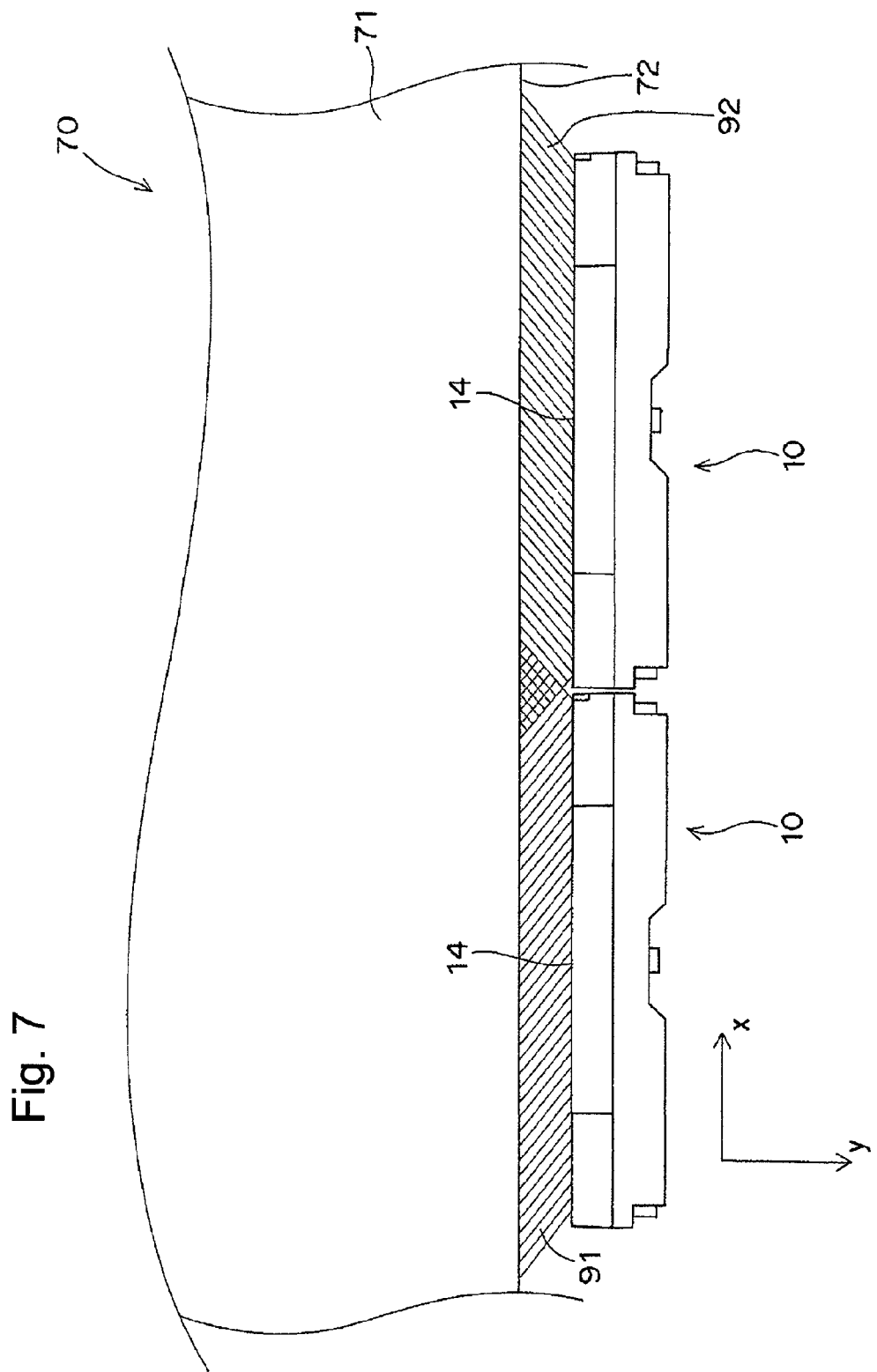

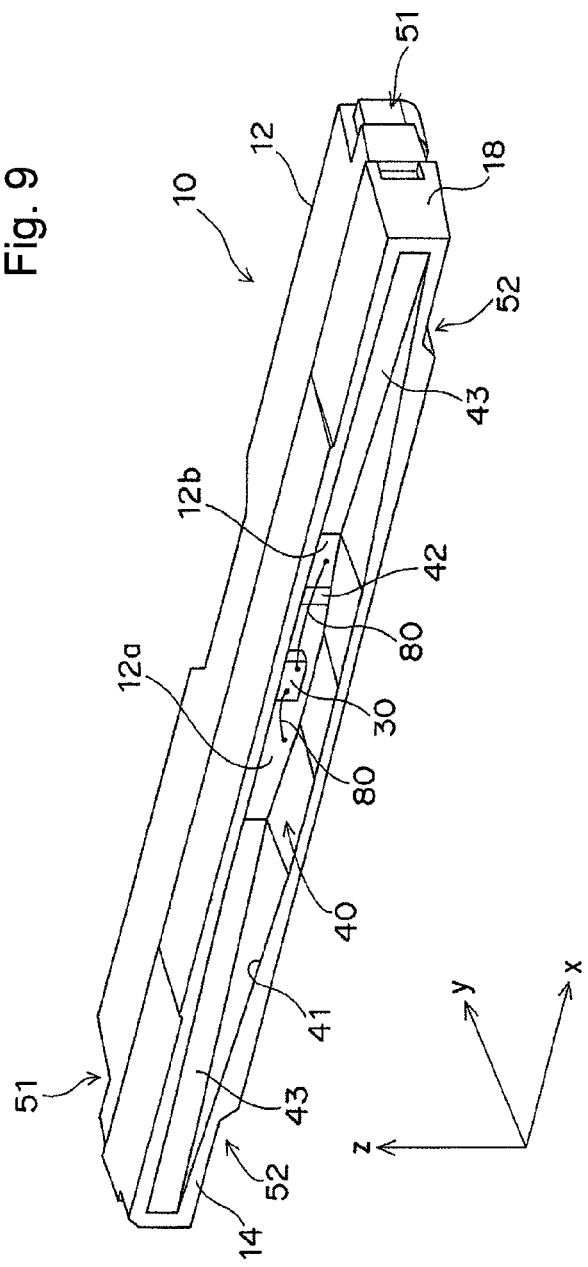

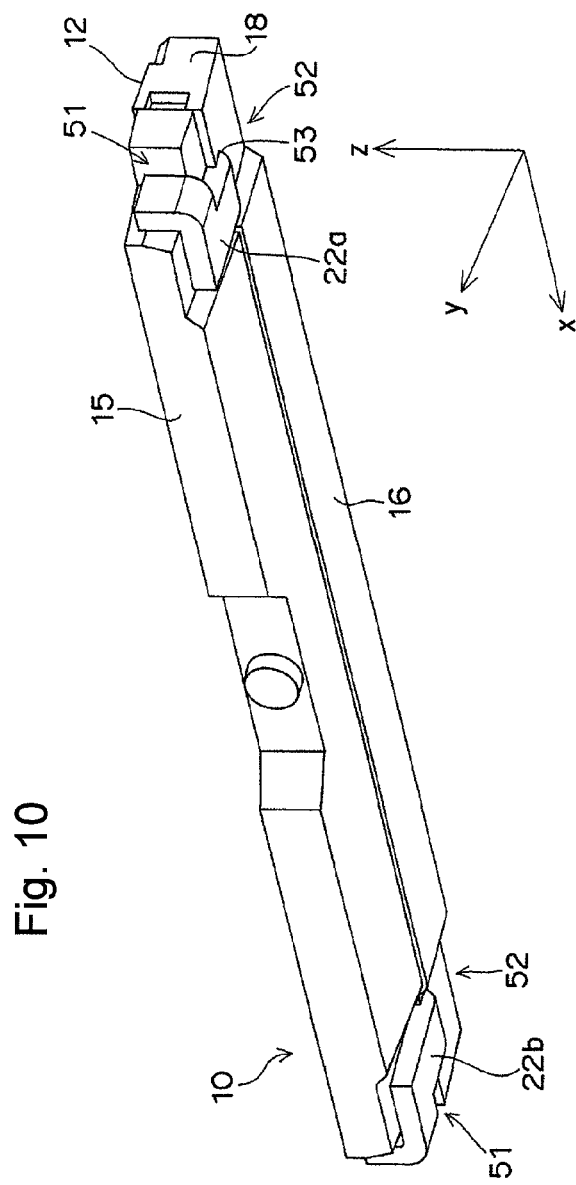

LIGHT EMITTING DEVICE

BACKGROUND OF THE INVENTION

1. Field of the Invention

The present invention relates to a light emitting device, particularly to a light emitting device suitable for backlight of liquid crystal display or the like.

2. Description of the Related Art

Surface light emitting apparatus, constituted from side-view type light emitting device and a light guide plate that spreads light emitted by the light emitting device into a beam having planar intensity distribution, is used as the backlight of liquid crystal display or the like. As one type of side-view type light emitting device suitable for the surface light emitting apparatus, such a low-profile light emitting device is known that has light emitting diodes disposed in a recess of a resin package having flat configuration (for example, refer to Japanese Unexamined Patent Unexamined Publication (Kokai) No. 2004-363537; and Japanese Unexamined Patent Unexamined Publication (Kokai) No. 2007-27761).

A surface light emitting apparatus is constituted, in case the light emitting device of Japanese Unexamined Patent Unexamined Publication (Kokai) No. 2004-363537; and Japanese Unexamined Patent Unexamined Publication (Kokai) No. 2007-27761 is combined with the light guide plate, a plurality of light emitting devices are typically disposed along the longitudinal direction of light receiving surface of the light guide plate. However, in the case of the light emitting device of Japanese Unexamined Patent Unexamined Publication (Kokai) No. 2004-363537; and Japanese Unexamined Patent Unexamined Publication (Kokai) No. 2007-27761, it is supposed that light emitted by the light emitting element disposed in the package does not spread sufficiently along the longitudinal direction of the light receiving surface of the light guide plate. As a result, portions between adjacent light emitting devices may remain dark, thus leading to unevenness in luminance called the firefly phenomenon, in which bright and dark portions are observed in the vicinity of the light receiving surface of the light guide plate.

While the unevenness in luminance may be eliminated by spreading the light emitted by the light emitting device uniformly over the entire light guide plate by using the light guide plate made in such a configuration that does not cause unevenness in luminance, such a light guide plate requires high manufacturing cost.

Another method of eliminating the unevenness in luminance is to dispose a large number of light emitting elements that are not packaged along the longitudinal direction of the light receiving surface of the light guide plate, although this method requires it to provide a larger number of light emitting elements for one light guide plate, thus resulting in higher cost.

SUMMARY OF THE INVENTION

Accordingly, it is an object of the present invention to provide a light emitting device that makes it possible to constitute a surface light emitting apparatus having less unevenness in luminance, without using a light guide plate made in such a configuration that does not cause unevenness in luminance or a large number of light emitting elements.

The light emitting device of the present invention comprises a light emitting element, connecting terminals connected with the light emitting element, a package which has a recess wherein the light emitting element is mounted and from which a part of each connecting terminal is projected outward, an opening of the recess being elongated in one direction, wherein both side walls of the recess positioned in the longitudinal direction of the recess are inclined surface, an angle $\theta$ between both the inclined surfaces being 90 degrees or more.

In the light emitting device of the present invention, since the opening of the recess is elongated in one direction and the angle between the side surfaces of the recess on both sides in the longitudinal direction is 90 degrees or more, light emitted by the light emitting element is spread sufficiently in the longitudinal direction of the recess so as to produce a band-shaped beam. As a result, when a plurality of light emitting elements are disposed along the longitudinal direction of the light receiving surface of the recess for constituting the surface light emitting apparatus, unevenness in luminance can be suppressed from occurring since dark portions are less likely to be generated between adjacent light emitting devices.

BRIEF DESCRIPTION OF THE DRAWINGS

FIG. 7 is a schematic top view of the backlight according to the first embodiment.

FIG. 9 is a schematic perspective view of the light emitting device according to the second embodiment as viewed from the front side.

FIG. 10 is a schematic perspective view of the light emitting device according to the second embodiment as viewed from the back side.

DETAILED DESCRIPTION OF THE INVENTION

Figure 1:
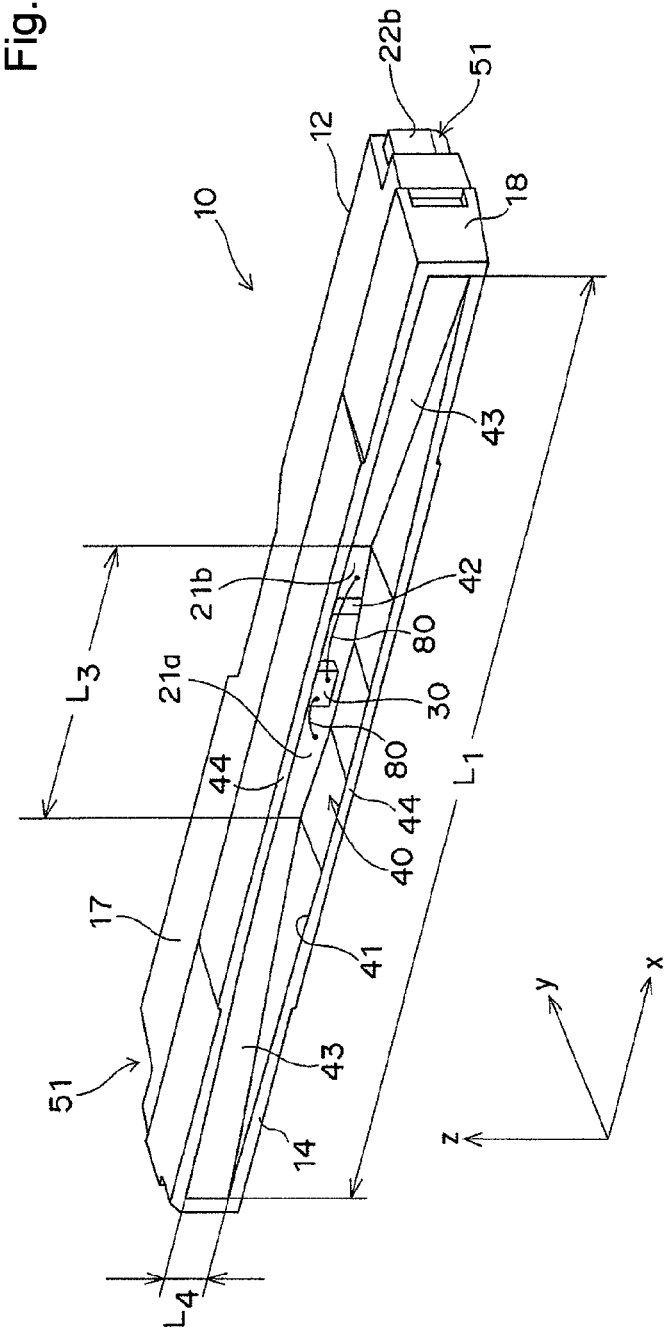
FIG. 1 is a schematic perspective view of the light emitting device according to the first embodiment as viewed from the front side.

Embodiments of the present invention will be described in detail below with reference to the accompanying drawings. In the description that follows, terms that represent particular directions and positions (such as up, down, right, left and other terms including the same) will be used. These terms are used for the purpose of making it easier to understand the present invention with reference to the accompanying drawings, and are not intended to restrict the scope of the present invention. Identical reference numeral used in a plurality of drawings indicates an identical portion or member.

First Embodiment

Figure 2:
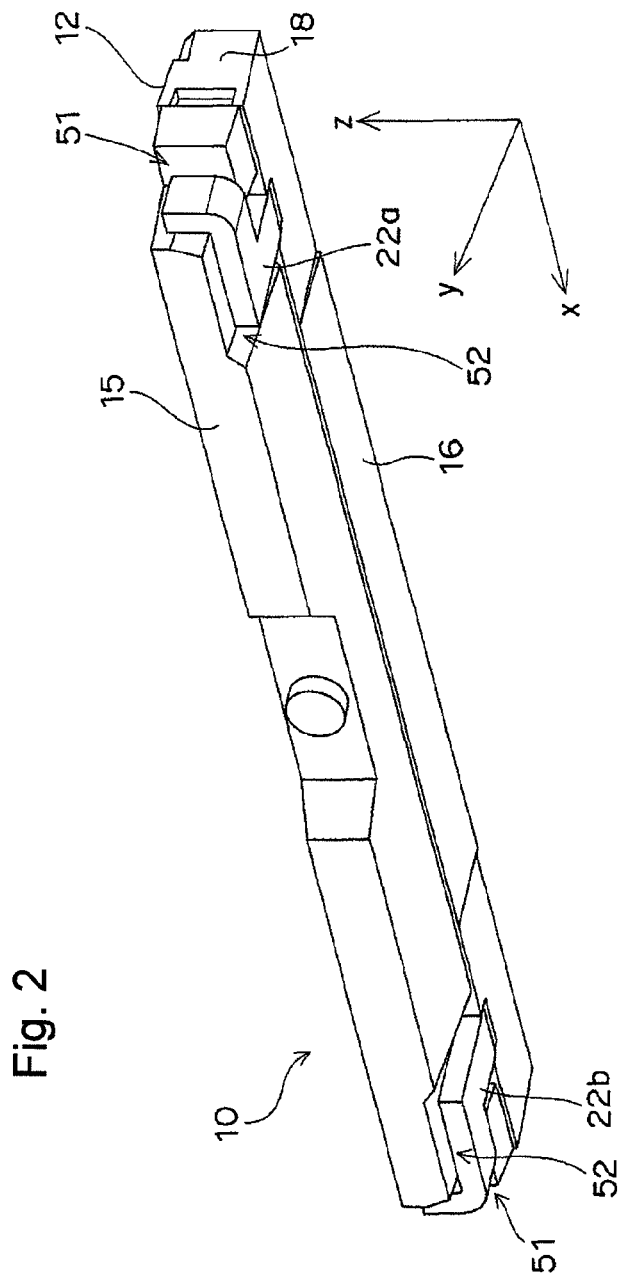
FIG. 2 is a schematic perspective view of the light emitting device according to the first embodiment as viewed from the back side.

FIG. 1 and FIG. 2 show a side-view type light emitting device 10 according to this embodiment. FIG. 3 to FIG. 6 show such a state as a package 12 used in the light emitting device 10 of this embodiment is cut off from a lead frame 20. The light emitting device 10 comprises the package 12 that has a recess 40, with a light emitting element 30 mounted in the recess 40. Lead electrodes 21a, 21b are exposed as connection terminals on the bottom surface 42 of the recess 40, with part of the lead electrodes 21a, 21b penetrating through the package 12 to protrude to the outside. The light emitting element 30 and the lead electrodes 21a, 21b are connected to each other by means of electrically conductive wires 80.

The recess 40 of the package 12 opens in one surface that serves as a light emitting surface 14, and the opening 41 is elongated in one direction (x direction). Among inner side surfaces of the recess 40, the side surfaces on both sides in the longitudinal direction (x direction) of the opening 41 are formed as inclined surfaces 43. The two inclined surfaces 43 incline so as to depart from each other from the bottom 42 to the opening 41 of the recess 40, and serve as reflectors that reflect the light emitted by the light emitting element 30 disposed on the bottom surface 42 of the recess 40. Among the inner side surfaces of the recess 40, the side surfaces on both sides in the longitudinal direction (x direction) of the opening 41 are substantially perpendicular to the bottom surface 42.

The lead electrodes 21a, 21b protrude toward the outside of the package 12 in substantially the same plane as the bottom surface 42 of the recess 40 (refer to FIG. 3 and FIG. 4), while the external terminals 22a, 22b of the lead electrodes 21a/21b that are used to supply power to the light emitting device 10 are soldered when mounting the device on an external apparatus (for example a circuit board). When the external terminals 22a, 22b are bent along the external surface of the package 12 as shown in FIG. 1 and FIG. 2, the device can be mounted in a smaller space. The external terminals 22a, 22b may be bent either toward the light emitting surface 14 of the package 12 or toward the back surface 15 that opposes the light emitting surface 14. It is preferable to bend the external terminals 22a, 22b toward the back surface 15, because this suppresses the solder from spreading to the light emitting surface 14 when mounting the light emitting device 10.

The light emitting element 30 can be secured onto one surface of the lead electrodes 21a, 21b that are exposed on the bottom surface 42 of the recess 40 as shown in FIG. 1. Then a pair of electrodes (not shown) formed on the surface of the light emitting element 30 and the lead electrodes 21a, 21b are connected with each other by means of the electrically conductive wires 80. Thus the light emitting element 30 disposed in the recess 40 of the package 12 can be energized through the external terminals 22a/22b of the lead electrodes 21a, 21b outside the package 12.

In order to protect the light emitting element 30 and the electrically conductive wires 80 from the environment, the recess 40 of the package 12 may be sealed with a translucent sealing resin.

The light emitting device 10 of the present invention is characterized in that the angle θ (refer to FIG. 4) between the two inclined surfaces 43 formed in the recess 40 of the package 12 is 90 degrees or more. The angle θ between the two inclined surfaces 43 has an influence on the diffusion of light emitted by the light emitting element 30. In case θ is larger than or equal to 90 degrees as in the present invention, light emitted by the light emitting element 30 spreads efficiently in the x direction, so that a band-shaped beam extending in the x direction is obtained.

This light emitting device 10 provides an advantage particularly when a plurality of light emitting devices 10 and a light guide plate 71 are combined to form a surface light emitting apparatus 70 as shown in FIG. 7. The surface light emitting apparatus 70 is constituted by disposed a plurality of light emitting devices 10 in the x direction. The light emitting surface 14 in which the opening 41 of the recess 40 opens is disposed on the side opposite to the light receiving surface 72 of the light guide plate 71. Since the light emitting device 10 of the present invention emits a emerging light 91 that extends in the x direction, the emerging light 91 emitted into the light guide plate 71 overlaps with a emerging light 92 emitted by another light emitting element 10 adjacent thereto while entering the light guide plate 71. As a result, while dark portion is formed between the light emitting devices 10 that adjoin each other in the conventional surface light emitting apparatus, the dark portion is not formed or is reduced in the surface light emitting apparatus 70 that employs the light emitting device 10 of the present invention.

When constituting the surface light emitting apparatus 70, a prism sheet (a sheet having a plurality of prism-shaped protrusions on one side thereof) may be provided on the surface of the light guide plate 71. Luminance of the surface light emitting device 70 and uniformity of light emission are affected by the orientation of the prism sheet with respect to the light guide plate 71. For example, when a prism sheet having the prism-shaped protrusions formed on one side thereof that opposes the light guide plate 71 (the prism sheet of such a configuration will be called reverse prism sheet) is used, luminance is increased although uniformity of light emission deteriorates. Use of the reverse prism sheet on a surface light emitting device that has a plurality of light emitting devices of the prior art makes it impossible to mount the light emitting devices with high density, and therefore dark portions are formed conspicuously. In the case of the surface light emitting apparatus 70 that employs the light emitting device 10 of the present invention, in contrast, since the light emitting devices can be mounted with high density, the reverse prism sheet can be used without conspicuous formation of dark portions and therefore surface light emitting apparatus having high luminance can be made.

Figure 5:
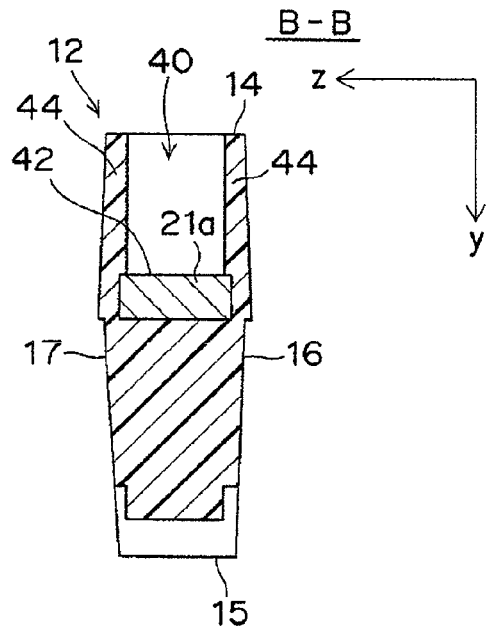
FIG. 5 is a schematic sectional view taken along lines B-B in FIG. 3.
Figure 6:
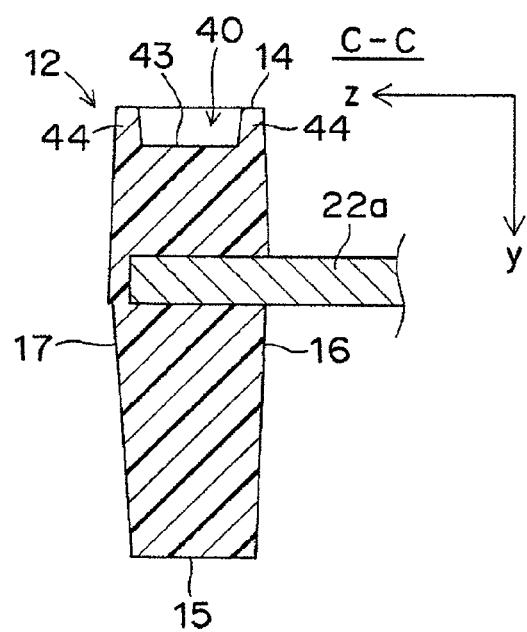
FIG. 6 is a schematic sectional view taken along lines C-C in FIG. 3.

The side wall 44 (refer to FIG. 1) of the recess 40 that extends in the x direction becomes thinner and lower in strength at a position of the bottom surface 42 of the recess 40 as shown in FIG. 5. Therefore, it is not preferable to form the external terminal 22a (refer to FIG. 3) of the lead electrode 21a so as to penetrate the side wall 44 and protrude to the mounting surface 16, which makes the side wall 44 too low in strength.

To avoid this problem, it is preferable to extend the lead electrode 21a in the x direction from the bottom surface 42 to the under side of the inclined surface 43 (refer to FIG. 3 and FIG. 4) and direct the external terminal 22a so as to protrude from the mounting surface 16, which makes is possible to prevent the side wall 44 from decreasing in strength.

It is furthermore preferable to form the external terminal 22a so as to protrude from a position near the outer side surface 18 (refer to FIG. 3 and FIG. 4) in the x direction of the package 12.

Uniformity of light emission of the band-shaped beam can be adjusted by changing the angle θ between the two inclined surfaces 43. It is particularly preferable to set the angle θ between the two inclined surfaces in a range from 135 to 165 degrees, since this enables it to achieve emission of relatively uniform light in the x direction.

With regard to the length of the inclined surface 43, it is preferable that length $L_2$ (refer to FIG. 4) of the inclined surface 43 measured in the direction in which the inclined surface 43 shows the steepest inclination (direction of maximal inclination) is larger than length $L_3$ (refer to FIG. 4) of the bottom surface 42 of the recess 40 measured in the x direction. In a range where the angle θ between the two inclined surfaces 43 is larger than or equal to 90 degrees, function of the inclined surface 43 as a reflector is enhanced and uniformity of light emission is improved when $L_2$ is larger than $L_3$.

Length $L_1$ of the opening 41 in the x direction is preferably from 2 to 4 times the length $L_3$ of the bottom surface 42 in the x direction. While the extent of the light emitted in band shape in x direction can be made longer when length $L_1$ is longer, uniformity of light emission tends to decrease when length $L_1$ is too long. It is most preferable that $L_1$ is from 2 to 4 times the length $L_3$, when uniformity of light emission is taken into consideration.

Length $L_1$ of the opening 41 in the x direction is preferably from 7 to 24 times the length $L_4$ of the opening 41 in a direction perpendicular to the x direction (z direction). When $L_1$ is 7 times the length $L_4$ or more, light emission becomes linear which is advantageous for use in combination with the light guide plate. It is preferable that $L_1$ is not larger than 24 times the length $L_4$, since relatively good uniformity of light emission in the longitudinal direction can be achieved in this case.

Depth d (refer to FIG. 4) of the bottom surface 42 from the opening 41 is preferably in a range from 0.2 to 0.4 times the length $L_3$ of the bottom surface 42 in the x direction. When relationship $d<L_3 \times 0.2$ holds, the light emitting element 30 and the electrically conductive wires 80 that connect the light emitting element 30 and the lead electrodes 21a, 21b may protrude from the recess 40, which is not desirable. When relationship $d>L_3 \times 0.4$ holds, on the other hand, distance between the light emitting element 30 and the opening 41 increases, which decreases the efficiency of extracting light and is not desirable.

The external terminals 22a, 22b of the lead electrodes 21a/21b are bent along the outer surface of the package 12. It is preferable to form a notch 51 (FIG. 1 and FIG. 2) or a step 52 (FIG. 2) that is capable of accommodating the thickness of the lead electrodes 21a, 21b in the outer surface of the package 12 at a position corresponding to the bend. This makes it possible to decrease the outer dimensions of the light emitting device 10, since the external terminals 22a, 22b that are bent do not protrude beyond the outer surface of the package 12.

When the external terminals 22a, 22b of the lead electrodes 21a, 21b are disposed in the notch 51 formed on the side of the back surface 15, in particular, the external terminals 22a, 22b that are bent do not protrude beyond the outer surface of the package 12 in the x direction. For this reason, when a plurality of light emitting devices 10 are combined with the light guide plate 70 as shown in FIG. 7, dimensions of the area between the openings 41 of adjacent light emitting device 10 (in which darkening occurs) can be made smaller by decreasing the distance of the package 12 of the adjacent light emitting device 10. Thus such an effect is produced as increasing the overlapping portion between the emerging lights 91, 92 thereby decreasing the dark portion formed between the light emitting devices 10.

It is also preferable that the external terminals 22a, 22b of the lead electrodes 21a, 21b are located at inner position than the outer surface of the package 12. While it is a common practice to use solder when mounting the light emitting device 10, solder fillets are formed between the external terminals 22a, 22b of the lead electrodes 21a/21b and electrodes of the external apparatus during soldering. In case the light emitting device 10 has the external terminals 22a/22b located at inner position than the outer surface of the package 12, the solder fillets can be formed at positions located inward than the outer surface of the package 12. This enables it to further decrease the distance between the packages 12 of the adjacent light emitting devices 10, thereby decreasing the distance between the openings 41 of the adjacent light emitting devices 10. Thus the overlapping portion between the emerging lights 91, 92 can be increased further and thereby the dark portion formed between the light emitting devices 10 can be decreased further.

The outer surface of the package 12 through which the external terminals 22a, 22b of the lead electrodes 21a/21b protrude is normally used as a mounting surface 16 that comes into contact with the external apparatus, so as to ensure good electrical conduction between the external apparatus and the lead electrodes 21a, 21b. Accordingly, it is preferable to form the step 52 in the mounting surface 16 for disposing the external terminals 22a, 22b therein as shown in FIG. 2, since this makes the mounting surface 16 flat and improves the stability of the light emitting device 10 during mounting.

A method for manufacturing the light emitting device 10 of the present invention will be described below with reference to FIG. 8A to FIG. 8D.

First, the lead frame 20 is made by punching through a metal sheet and coating the surface thereof with metal plating. The lead frame 20 has a pair of lead electrodes 21a, 21b that oppose each other at a distance from each other. Typically, a plurality of pairs of lead electrodes 21a, 21b are formed on one lead frame 20.

Figure 8A:
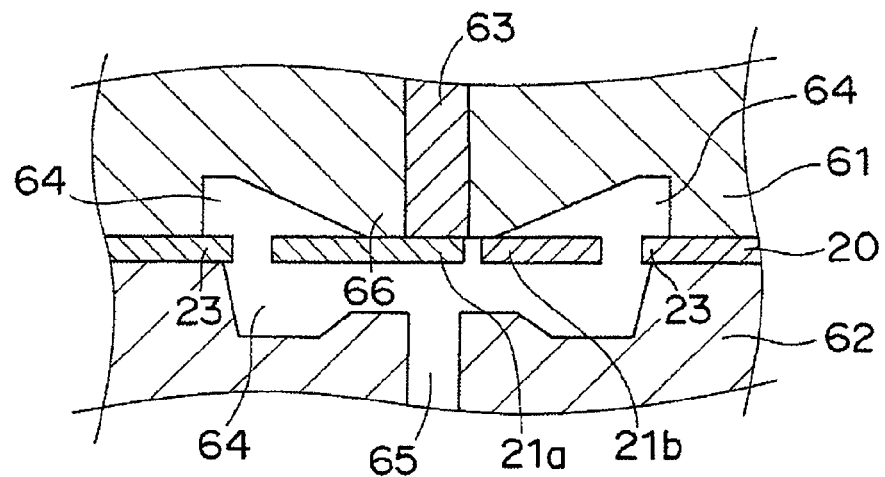
FIG. 8A is a schematic sectional view explanatory of the method of manufacturing the package according to the first embodiment.

Then as shown in FIG. 8A, the lead frame 20 is placed between mold dies 61, 62 that are disposed one on another and used for molding the package, so as to hold the lead frame 20 between the mold dies 61, 62. At this time, distal ends of the lead electrodes 21a, 21b and the hanger lead 23 are disposed in a cavity 64 of the mold dies 61, 62 that have the shape of the package 12.

Figure 8B:
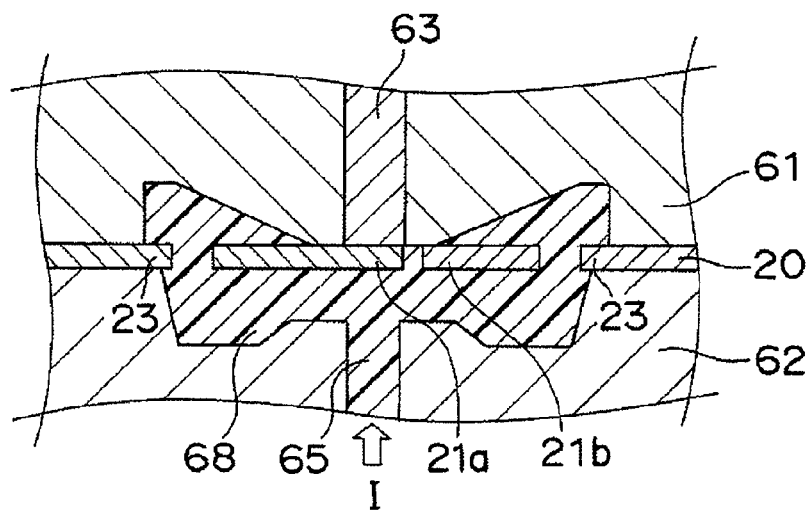
FIG. 8B is a schematic sectional view explanatory of the method of manufacturing the package according to the first embodiment.
Figure 8C:
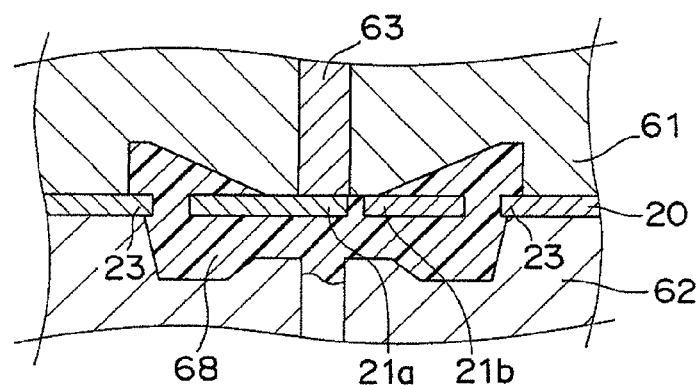
FIG. 8C is a schematic sectional view explanatory of the method of manufacturing the package according to the first embodiment.
Figure 8D:
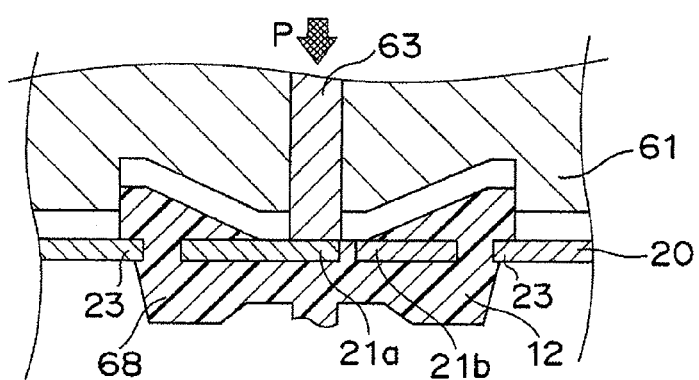
FIG. 8D is a schematic sectional view explanatory of the method of manufacturing the package according to the first embodiment.

Then as shown in FIG. 8B, a molding material 68 is poured into the cavity 64 of the mold dies 61, 62 through a pouring gate 65 of the lower mold die 62. The upper mold die 61 has a protrusion 66 that corresponds to the recess 40 of the package 12. As the molding material is poured when the protrusion 66 is in contact with the top surfaces of the lead electrodes 21a, 21b, the molding material does not make contact with the top surfaces of lead electrodes 21a, 21b, so that the lead electrodes 21a, 21b can be exposed on the bottom surface of the recess 40 of the package 12.

When the molding material 68 has hardened in the mold dies 61, 62 (FIG. 8C), the lower mold die 62 is removed, then the upper mold die 61 is removed as shown in FIG. 5D. When the upper mold die 61 is removed, the package 12 can be easily taken out of the upper mold die 61 by pushing out, in P direction, an ejector pin 63 that is inserted slidably in the upper mold die 61.

Figure 3:
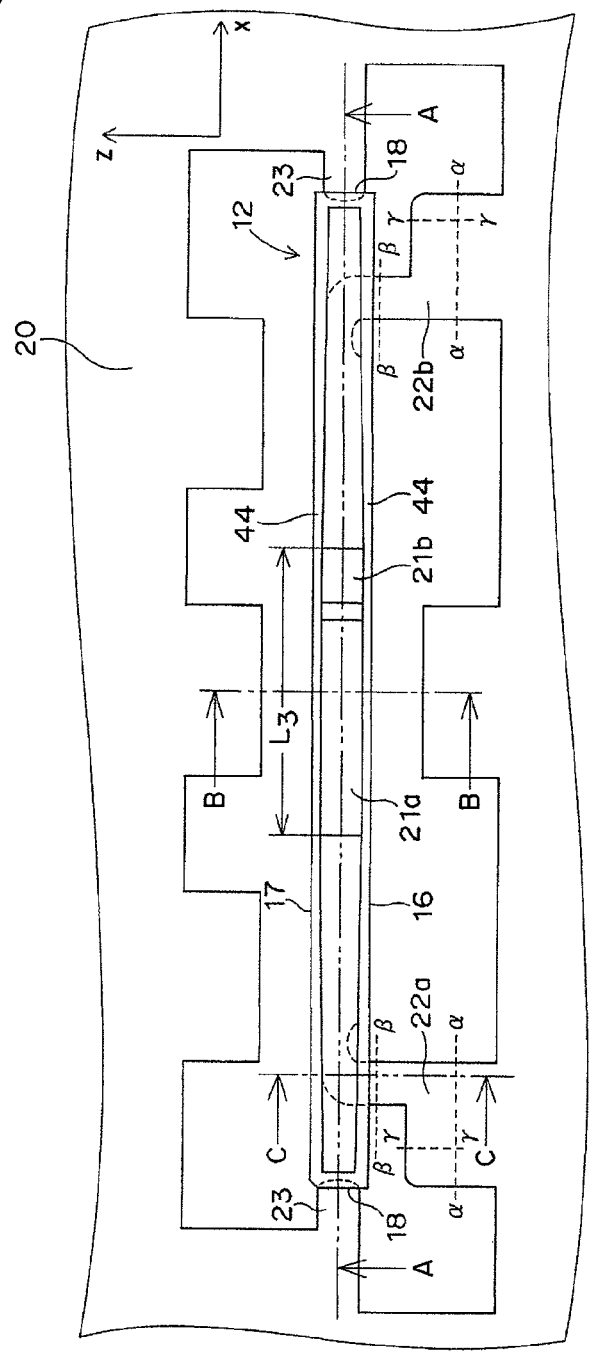
FIG. 3 is a schematic front view of the package according to the first embodiment before being cut off from the lead frame.
Figure 4:
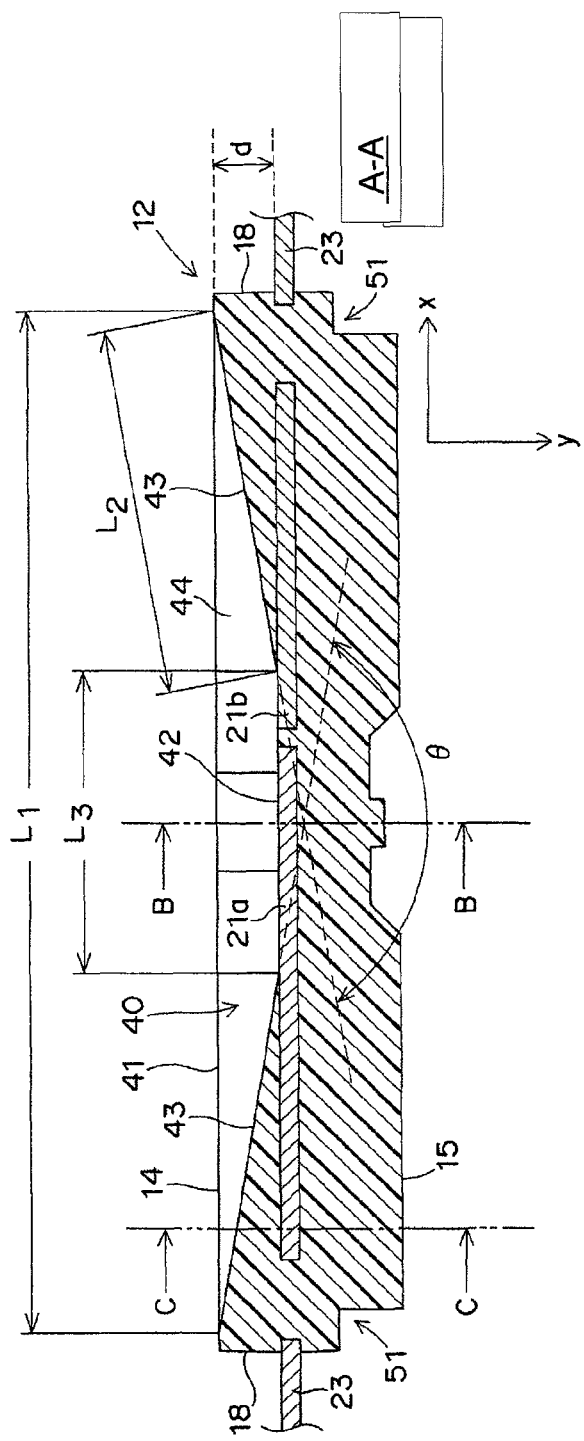
FIG. 4 is a schematic sectional view taken along lines A-A in FIG. 3.

The package 12 fastened onto the lead frame 20 as shown in FIG. 3 is obtained through the series of processes shown in FIG. 8A to FIG. 8D. While only one package 12 is shown in FIG. 3, typically a plurality of packages 12 are formed on one lead frame 20. In order to manufacture a plurality of packages 12, the mold dies 61, 62 that have a plurality of cavities 64 corresponding to the packages are used. As the molding material is poured into the plurality of cavities 64 simultaneously, the plurality of packages 12 can be formed simultaneously.

Processes of mounting the light emitting element 30 and other components on the package 12 that is secured onto the lead frame 20 and making the individual light emitting devices 10 will now be described with reference to FIG. 1 to FIG. 3.

First, the light emitting element 30 is secured in the recess 40 of the package 12. The light emitting element 30 is die-bonded onto one of the lead electrodes 12a that are exposed on the bottom surface 42 of the recess 40. Then the positive and negative electrodes of the light emitting element 30 are connected to the lead electrodes 21a, 21b with the electrically conductive wires 80 by wire bonding. The recess 40 may be filled with a translucent sealing resin as required. Also the sealing resin may include a fluorescent material or a filler.

Then the external terminals 22a, 22b of the lead electrodes 21a, 21b are cut off from the lead frame 20 at the position indicated by dashed line a in FIG. 3. At this time, the package 12 is supported by the hanger lead 23 that sticks into the outer surface in x direction. Then the external terminals 22a, 22b are bent toward the back surface 15 (y direction in FIG. 2) of the package 12 at a position indicated by dashed line γ. The external terminals 22a, 22b are further bent toward the top surface 17 (z direction) that opposes the mounting surface 16 at a position indicated by dashed line β, and are disposed on the step 52 of the mounting surface 16. At this time, the portion that has been bent along the dashed line γ is disposed in the notch 51 on the side of the back surface 15.

When bending of the external terminals 22a, 22b of the lead electrodes 21a, 21b has been completed, the package 12 is removed from the hanger lead 23. The hanger lead 23 is not so high in strength, and can therefore be bent and pulled off the package 12 easily.

Constituent members of the light emitting device 10 will be described in detail below.

Light Emitting Element 30

The light emitting element 30 is preferably a semiconductor light emitting element such as light emitting diode. The light emitting element 30 having various emission wavelengths may be used.

Lead Electrodes 21a, 21b

There is no restriction on the material used to form lead electrodes 21a, 21b, as long as it has electrical conductivity. For example, iron, copper, copper-clad iron, copper-clad tin and aluminum, iron, copper or the like plated with copper, gold or silver may be preferably used.

Package 12

For the molding material for the package 12, thermoplastic resins such as a liquid crystal polymer, a polyphthalamide resin, and polybutyrene terephthalate (PET). Particularly it is preferable to use a semi-crystalline polymer resin that includes a crystal of a high melting point such as a polyphthalamide resin, since it has high surface energy and therefore shows good bonding with the sealing resin that fills the recess 40 of the package 12. Use of this material makes such a trouble less likely to occur as the package and the sealing resin separate from each other when the resin is cooled down during the process pf hardening the resin that has filled the recess 40. The molding material may include a white pigment such as titanium oxide or the like mixed therein, so that the package 12 reflects light from the light emitting element 30 more efficiently.

Electrically Conductive Wire 80

For the electrically conductive wire 80 used in wire bonding, a wire formed from a metal such as gold, copper, platinum or aluminum, or an alloy thereof may be used.

Second Embodiment

In the first embodiment described above, the step 52 (refer to FIG. 2) is formed in the mounting surface 16 of the package 12 in such a manner as the external terminals 22a, 22b can be accommodated therein when the external terminals 22a, 22b of the lead electrodes 21a, 21b are bent toward the back surface 15. The step 52 is not formed on the side of the light emitting surface 14 beyond the position where the external terminals 22a, 22b protrude from the package 12.

This embodiment is difference from the first embodiment in that the step 52 is formed also on the side of the light emitting surface 14 beyond the position where the external terminals 22a, 22b protrude from the package 12 (refer to FIG. 10). With other respects, this embodiment is the same as the first embodiment.

The step 52 is located inward from the mounting surface 16. The lead electrodes 21a, 21b protrude beyond the position of the step 52 of the mounting surface 16. That is, a boundary portion 53 between the external terminals 22a, 22b of the lead electrodes 21a, 21b and the outer surface of the package 12 is located in the step 52.

In the package 12 through which the lead electrodes 21a, 21b penetrate as in the present invention, burrs are likely generated in the boundary between the surface of the package 12 and the lead electrodes 21a, 21b. The boundary potion 53 is located in the step 52 so that burrs in the boundary portion 53 are located inner than the mounting surface 16. As a result, the burrs do not touch the external apparatus when the light emitting device 10 is mounted in the external apparatus, thus enabling stable mounting.

Example 1

Luminance distribution at the center was simulated for the light emitting device 10 shown in FIG. 1. The "luminance distribution at the center" as used herein means the luminance distribution along a line that passes the center of the package 12 in the direction perpendicular to the longitudinal direction of the package 12 (z direction), and extends in the longitudinal direction of the package 12 (x direction).

Dimensions of four kinds of the light emitting device 10 (Examples 1 to 4) that were simulated are shown in Table 1.

TABLE 1

| | Example 1 | Example 2 | Example 3 | Example 4 |
|---|---|---|---|---|
| Length $L_1$ of the opening in x direction (mm) | 4.76 | 4.76 | 5.76 | 5.76 |
| Length $L_2$ of the inclined surface (mm) | 1.61 | 1.64 | 2.09 | 2.12 |
| Length $L_3$ of the bottom surface (mm) | 1.7 | 1.7 | 1.7 | 1.7 |
| Length $L_4$ of the opening in z direction (mm) | 0.29 | 0.29 | 0.29 | 0.29 |

TABLE 1-continued

|  | Example 1 | Example 2 | Example 3 | Example 4 |
|---|---|---|---|---|
| Depth d of the recess (mm) | 0.5 | 0.6 | 0.5 | 0.6 |
| Angle θ between the two inclined surfaces (degrees) | 143.8 | 137.2 | 152.3 | 147.1 |

Figure 11:
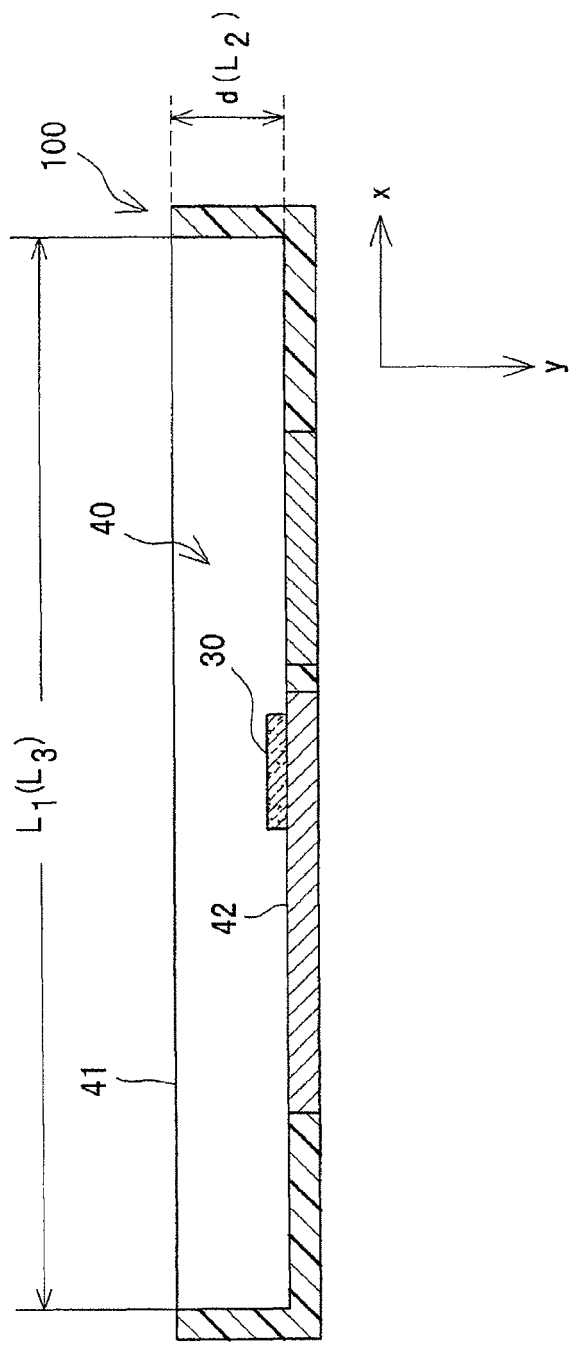
FIG. 11 is a schematic sectional view showing the comparative light emitting device used in the simulation of luminance distribution.
Figure 12A:
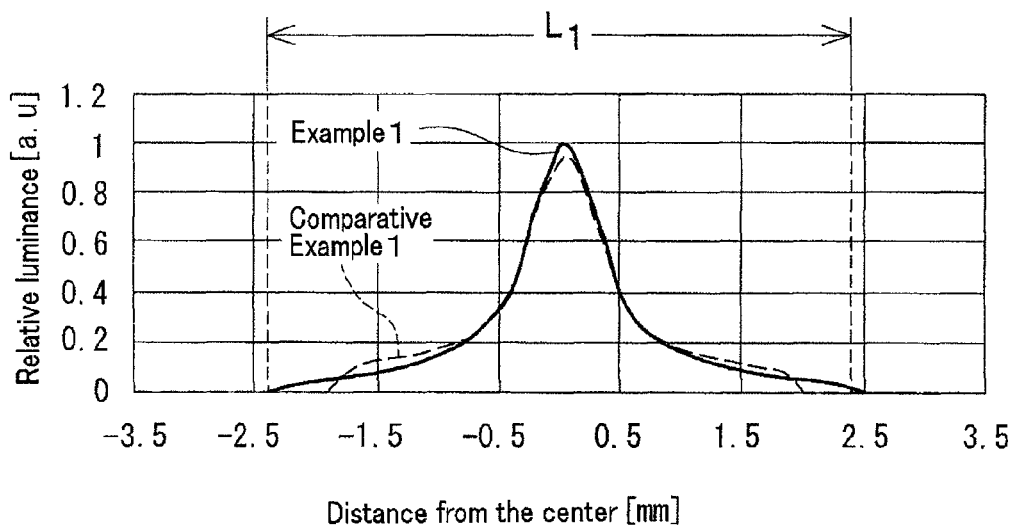
FIG. 12A shows the simulated luminance distributions at the center of Example 1 and Comparative Example 1.
Figure 12B:
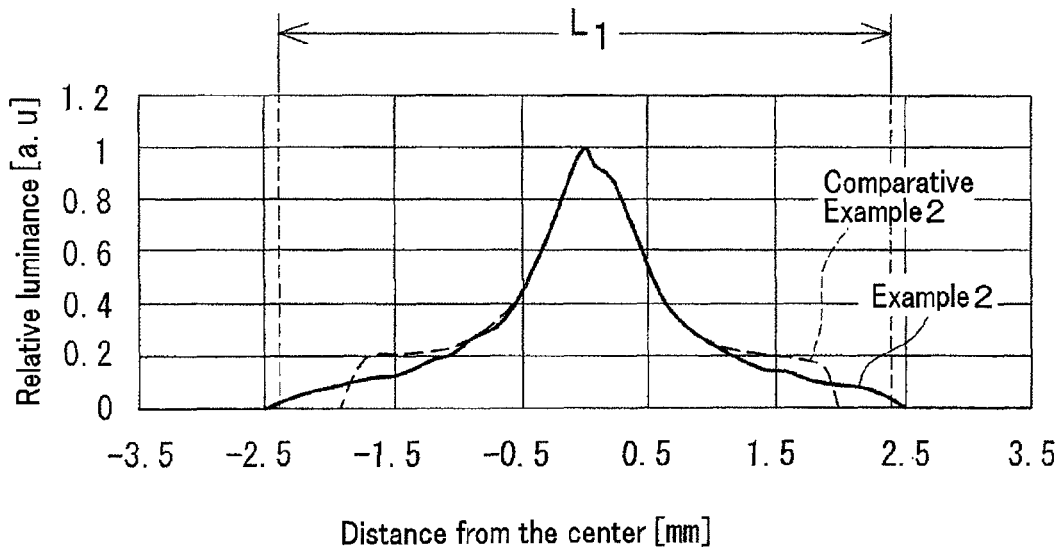
FIG. 12B shows the simulated luminance distributions at the center of Example 2 and Comparative Example 2.
Figure 12C:
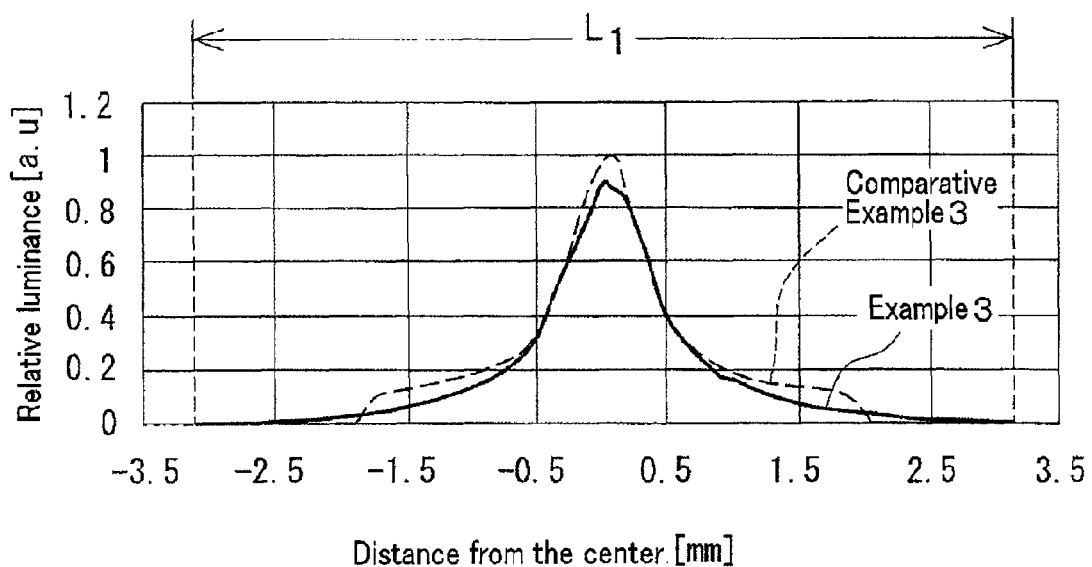
FIG. 12C shows the simulated luminance distributions at the center of Example 3 and Comparative Example 3.
Figure 12D:
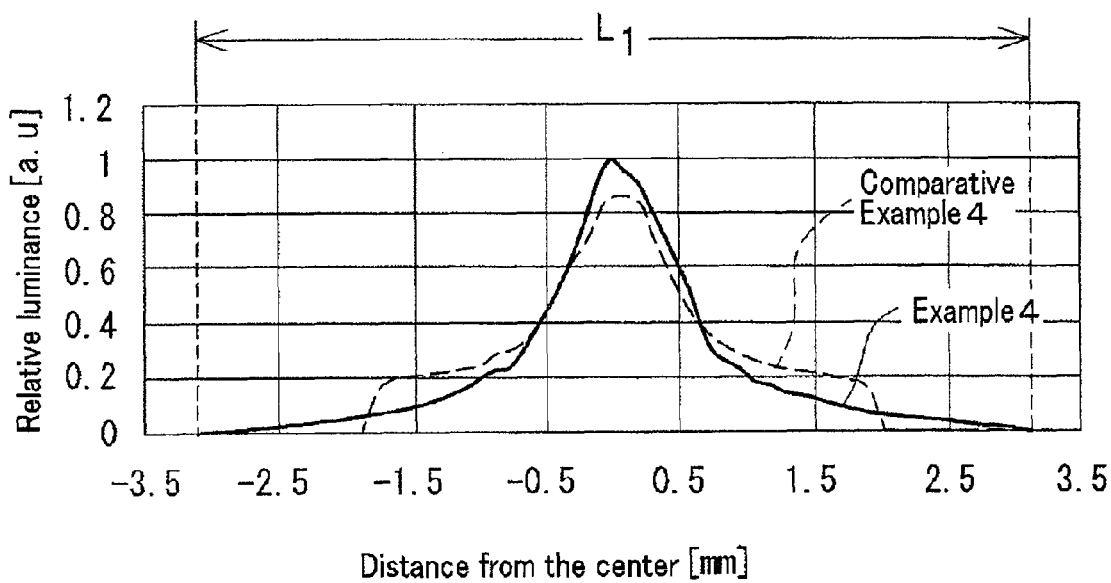
FIG. 12D shows the simulated luminance distributions at the center of Example 4 and Comparative Example 4.

For the purpose of comparison, luminance distribution at the center was simulated for comparative light emitting devices 100 (refer to FIG. 11) where the two inclined surfaces 43 of the light emitting device 10 are formed perpendicular to the bottom surface 42. Dimensions of the comparative light emitting devices 100 are shown in Table 2.

TABLE 2

|  | Comparative Example 1 | Comparative Example 2 | Comparative Example 3 | Comparative Example 4 |
|---|---|---|---|---|
| Length $L_1$ of the opening in x direction (mm) | 4.76 | 4.76 | 5.76 | 5.76 |
| Length $L_2$ of the inclined surface (mm) | 0.5 | 0.6 | 0.5 | 0.6 |
| Length $L_3$ of the bottom surface (mm) | 4.76 | 4.76 | 5.76 | 5.76 |
| Length $L_4$ of the opening in z direction (mm) | 0.29 | 0.29 | 0.29 | 0.29 |
| Depth d of the recess (mm) | 0.5 | 0.6 | 0.5 | 0.6 |
| Angle θ between the two inclined surfaces (degrees) | 0 | 0 | 0 | 0 |

FIG. 12A to FIG. 12D are luminance distribution curves obtained by the simulation of Example (solid line) and Comparative Example (dashed line). In each of these drawings, results of Example and Comparative Example that have the same length $L_1$ of the opening in x direction and same depth d of the recess are plotted in the same graph. The luminance is plotted along the horizontal axis of the distance in x direction from the center of the package 12.

As will be understood from FIG. 12A to FIG. 12D, light spreads over an area of about 4 mm, not over the entire length $L_1$ of the opening in the light emitting devices of Comparative Examples 1 to 4. In contrast, in the light emitting devices 10 of Examples 1 to 4, in contrast, light spreads over the entire length $L_1$ of the opening. Thus it can be seen that light spreads along the longitudinal direction of the opening and band-shape light beam is obtained in the light emitting device 10 of the present invention.

The light emitting device of the present invention can be used in an apparatus that requires an extremely low-profile light emitting member such as backlight of liquid crystal display or the like.

What is claimed is:

1. A light emitting device comprising:
a light emitting element;
connecting terminals connected with the light emitting element, the connecting terminals having external terminals;
a package which has a recess wherein the light emitting element is mounted and from which a part of each connecting terminal is projected outward, an opening of the recess being elongated in one direction in a light emitting surface of the package, the package further having an outer back surface which is on an opposite side from the light emitting surface of the package, and
wherein the package is made from a material different from the material of which said connecting terminals are made,
wherein both side walls of the recess positioned in the longitudinal direction of the recess are inclined surface, an angle θ between both the inclined surfaces being in a range from 135 to 165 degrees,
the package has one or more notches formed in an outer surface of the package between said outer back surface and an outer side surface of the package,
the external terminals are arranged in the one or more notches, and disposed inwardly from said outer back surface of the package, so that, for each of the external terminals:
an outer back surface of the external terminal that is farthest from the light emitting surface of the package is on an opposite side from the light emitting surface of the package, and
along a direction perpendicular to the light emitting surface of the package, said outer back surface of the external terminal is disposed at a distance from the light emitting surface of the package that is shorter than the distance between the light emitting surface of the package and said outer back surface of the package, and
the external terminals are also disposed inwardly from the outer side surface of the package.

2. The light emitting device according to claim 1, wherein a depth d of the recess measured from the opening to a bottom surface is from 0.2 to 0.4 times a length $L_3$ of the bottom surface of the recess in the longitudinal direction.

3. The light emitting device according to claim 1, wherein a length of each inclined surface in the direction of maximal inclination is larger than a length $L_3$ of the bottom surface of the recess in the longitudinal direction.

4. The light emitting device according to claim 1, wherein a length $L_1$ of the opening in the longitudinal direction is from 2 to 4 times a length $L_3$ of a bottom surface of the recess in the same direction.

5. The light emitting device according to claim 1, wherein a length $L_1$ of the opening in the longitudinal direction is from 7 to 24 times a length $L_4$ of the opening in a direction perpendicular to the longitudinal direction.

6. The light emitting device according to claim 1, wherein the external terminals are bent in the one or more notches.

7. The light emitting device according to claim 1, wherein the external terminals are bent along the external surface of the package and do not protrude beyond the outer surface of the package.

8. The light emitting device according to claim 1, wherein each external terminal is extended from a bottom surface of the recess to the under side of each inclined surface along the longitudinal direction of the recess then toward an outside of the package along a direction perpendicular to the longitudinal direction and parallel to the light emitting surface.

9. A surface light emitting apparatus comprising:
a light guide plate; and
a plurality of light emitting devices which are the light emitting devices according to claim 1,
wherein the light emitting devices are arranged in the longitudinal direction of the opening of the package so that the opening of each package oppose a light receiving surface of the light guide plate, and
wherein, in the area between the two light emitting devices, light beams emitted from two adjacent light emitting devices overlap each other and enter the light guide plate.

10. A light emitting device comprising:
a light emitting element;
connecting terminals connected with the light emitting element, the connecting terminals having external terminals;
a package which has a recess wherein the light emitting element is mounted and from which a part of each connecting terminal is projected outward, an opening of the recess being elongated in one direction more than in another direction in a light emitting surface of the package, wherein said longer direction of the recess opening is a longitudinal direction,
the package further having an outer back surface which is on an opposite side from the light emitting surface of the package, and
wherein the package is made from a material different from the material of which said connecting terminals are made,
wherein both side walls of the recess positioned in the longitudinal direction of the recess are inclined surface, an angle θ between both the inclined surfaces being 90 degrees or more, and
wherein a length $L_1$ of the opening in the longitudinal direction is from 2 to 4 times a length $L_3$ of a bottom surface of the recess in the same direction,
the package has one or more notches formed in an outer surface of the package between said outer back surface and an outer side surface of the package,
the external terminals are arranged in the one or more notches, and disposed inwardly from said outer back surface of the package, so that, for each of the external terminals:
an outer back surface of the external terminal that is farthest from the light emitting surface of the package is on an opposite side from the light emitting surface of the package, and
along a direction perpendicular to the light emitting surface of the package, said outer back surface of the external terminal is disposed at a distance from the light emitting surface of the package that is shorter than the distance between the light emitting surface of the package and said outer back surface of the package, and
the external terminals are also disposed inwardly from the outer side surface of the package.

11. The light emitting device according to claim 10, wherein a length $L_1$ of the opening in the longitudinal direction is from 7 to 24 times a length $L_4$ of the opening in a direction perpendicular to the longitudinal direction.

12. The light emitting device according to claim 10, wherein a depth d of the recess measured from the opening to a bottom surface is from 0.2 to 0.4 times a length $L_3$ of the bottom surface of the recess in the longitudinal direction.

13. The light emitting device according to claim 10, wherein a length of each inclined surface in the direction of maximal inclination is larger than a length $L_3$ of the bottom surface of the recess in the longitudinal direction.

14. The light emitting device according to claim 10, wherein the external terminals are bent in the one or more notches.

15. The light emitting device according to claim 10, wherein the external terminals are bent along the external surface of the package and do not protrude beyond the outer surface of the package.

16. The light emitting device according to claim 10, wherein each external terminal is extended from a bottom surface of the recess to the under side of each inclined surface along the longitudinal direction of the recess then toward an outside of the package along a direction perpendicular to the longitudinal direction and parallel to the light emitting surface.

17. A surface light emitting apparatus comprising:
a light guide plate; and
a plurality of light emitting devices which are the light emitting devices according to claim 10,
wherein the light emitting devices are arranged in the longitudinal direction of the opening of the package so that the opening of each package oppose a light receiving surface of the light guide plate, and
wherein, in the area between the two light emitting devices, light beams emitted from two adjacent light emitting devices overlap each other and enter the light guide plate.

18. A light emitting device comprising:
a light emitting element;
connecting terminals connected with the light emitting element, the connecting terminals having external terminals;
a package which has a recess wherein the light emitting element is mounted and from which a part of each connecting terminal is projected outward, an opening of the recess being elongated in one direction in a light emitting surface of the package, the package further having an outer back surface which is on an opposite side from the light emitting surface of the package, and
wherein the package is made from a material different from the material of which said connecting terminals are made,
wherein both side walls of the recess positioned in the longitudinal direction of the recess are inclined surface, an angle θ between both the inclined surfaces being 90 degrees or more, and
wherein a length $L_1$ of the opening in the longitudinal direction is from 7 to 24 times a length $L_4$ of the opening in a direction perpendicular to the longitudinal direction, and
the package has one or more notches formed in an outer surface of the package between said outer back surface and an outer side surface of the package, and
the external terminals are arranged in the one or more notches, and disposed inwardly from said outer back surface of the package, so that, for each of the external terminals:
an outer back surface of the external terminal that is farthest from the light emitting surface of the package is on an opposite side from the light emitting surface of the package, and
along a direction perpendicular to the light emitting surface of the package, said outer back surface of the external terminal is disposed at a distance from the light emitting surface of the package that is shorter than the distance between the light emitting surface of the package and said outer back surface of the package, and
the external terminals are also disposed inwardly from the outer side surface of the package.

19. The light emitting device according to claim 18, wherein a depth d of the recess measured from the opening to a bottom surface is from 0.2 to 0.4 times a length $L_3$ of the bottom surface of the recess in the longitudinal direction.

20. The light emitting device according to claim 18, wherein a length of each inclined surface in the direction of maximal inclination is larger than a length $L_3$ of the bottom surface of the recess in the longitudinal direction.

21. The light emitting device according to claim 18, wherein the external terminals are bent in the one or more notches.

22. The light emitting device according to claim 18, wherein the external terminals are bent along the external surface of the package and do not protrude beyond the outer surface of the package.

23. The light emitting device according to claim 18, wherein each external terminal is extended from a bottom surface of the recess to the under side of each inclined surface along the longitudinal direction of the recess then toward an outside of the package along a direction perpendicular to the longitudinal direction and parallel to the light emitting surface.

24. A surface light emitting apparatus comprising:
- a light guide plate; and
- a plurality of light emitting devices which are the light emitting devices according to claim 18,
- wherein the light emitting devices are arranged in the longitudinal direction of the opening of the package so that the opening of each package oppose a light receiving surface of the light guide plate, and
- wherein, in the area between the two light emitting devices, light beams emitted from two adjacent light emitting devices overlap each other and enter the light guide plate.

* * * * *